(12) United States Patent
Tanaka et al.

(10) Patent No.: US 6,227,287 B1
(45) Date of Patent: May 8, 2001

(54) COOLING APPARATUS BY BOILING AND COOLING REFRIGERANT

(75) Inventors: Hiroshi Tanaka, Toyoake; Kazuo Kobayashi, Kariya; Tadayoshi Terao, Toyoake; Kiyoshi Kawaguchi, Toyota; Tatsuhito Matsumoto, Kariya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/317,382

(22) Filed: May 24, 1999

(30) Foreign Application Priority Data

May 25, 1998 (JP) ............................... 10-142619
Aug. 31, 1998 (JP) ............................... 10-245483
May 21, 1999 (JP) ............................... 11-141388

(51) Int. Cl.[7] .................. F28D 15/00; H05K 7/20; H01L 23/34
(52) U.S. Cl. ................. 165/80.4; 165/104.33; 165/104.26; 361/700; 257/715
(58) Field of Search ............... 165/104.33, 104.26, 165/80.4; 361/700; 257/715

(56) References Cited

U.S. PATENT DOCUMENTS

| | | | |
|---|---|---|---|
| 3,613,778 | * 10/1971 | Feldman, Jr. | 165/104.26 |
| 3,749,159 | * 7/1973 | Meijer | 165/104.26 |
| 3,754,594 | * 8/1973 | Ferrell | 165/104.26 |
| 4,046,190 | * 9/1977 | Marcus et al. | 165/104.26 |
| 4,116,266 | * 9/1978 | Sawata et al. | 165/104.26 |
| 4,274,479 | * 6/1981 | Eastman | 165/104.26 |
| 4,503,483 | * 3/1985 | Basiulis | 165/104.33 |
| 4,944,344 | * 7/1990 | Crowe | 165/104.33 |
| 5,390,077 | * 2/1995 | Paterson | 165/104.33 |
| 5,566,751 | * 10/1996 | Anderson et al. | 165/104.26 |
| 5,764,483 | * 6/1998 | Ohashi et al. | 165/104.33 |
| 5,771,967 | * 6/1998 | Hyman | 165/274 |
| 6,101,715 | * 8/2000 | Fuesser et al. | 165/80.4 |

FOREIGN PATENT DOCUMENTS

| | | | |
|---|---|---|---|
| 54-72556 | * 1/1980 | (JP). | |
| 0232448 | * 12/1984 | (JP) | 165/104.33 |
| 10-209355 | 8/1998 | (JP). | |
| 10-209356 | 8/1998 | (JP). | |
| 11-087583 | 3/1999 | (JP). | |
| 0653497 | * 1/1980 | (SU) | 165/104.26 |
| 0705235 | * 1/1980 | (SU) | 165/104.26 |

* cited by examiner

Primary Examiner—Ira S. Lazarus
Assistant Examiner—Tho Duong
(74) Attorney, Agent, or Firm—Harness, Dickey & Pierce, PLC

(57) ABSTRACT

A cooling apparatus for cooling a heating body such as a CPU by boiling and condensing refrigerant has a tank having a heating body mounting portion on which the CPU is mounted; a porous metallic sintered body arranged in the tank; and refrigerant contained in the tank. The tank has a pair of faced walls including a heat-receiving wall and a radiation wall. The porous metallic sintered body is arranged along the heat-receiving wall, and transports the refrigerant collected at the bottom of the tank to an adjacent portion of the heating body mounting portion by using a capillary action. Since the refrigerant is boiled at such a wide adjacent portion, a superheat degree of the heating body mounting portion can decrease. Furthermore, since the refrigerant collected at the bottom of the tank is transported to the adjacent portion by the capillary action, an area of the radiation wall soaked in the refrigerant becomes small. As a result, a condensation area for condensing the vapor refrigerant becomes large, and then the supercool degree of the radiation wall can decrease. In this way, a cooling capacity of the cooling apparatus can increase.

20 Claims, 14 Drawing Sheets

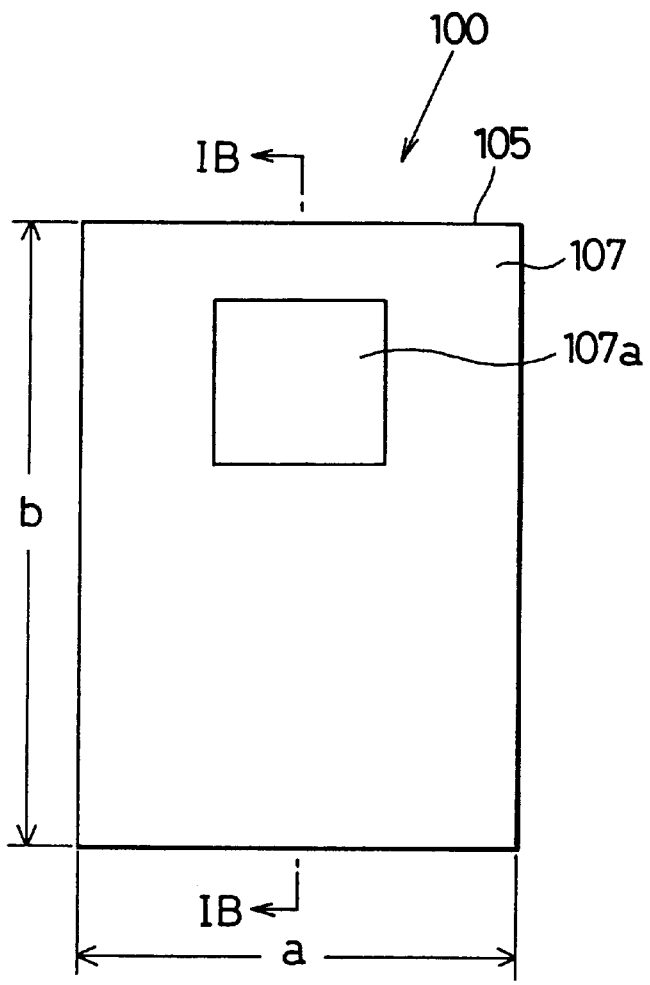
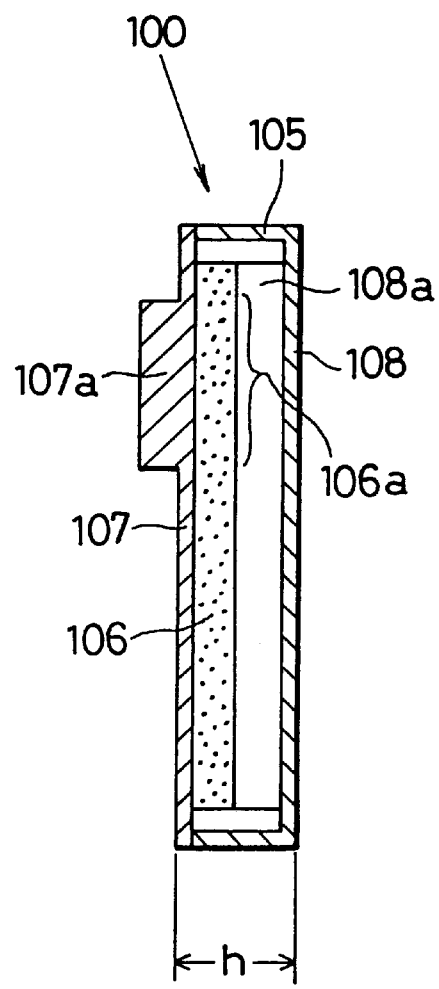

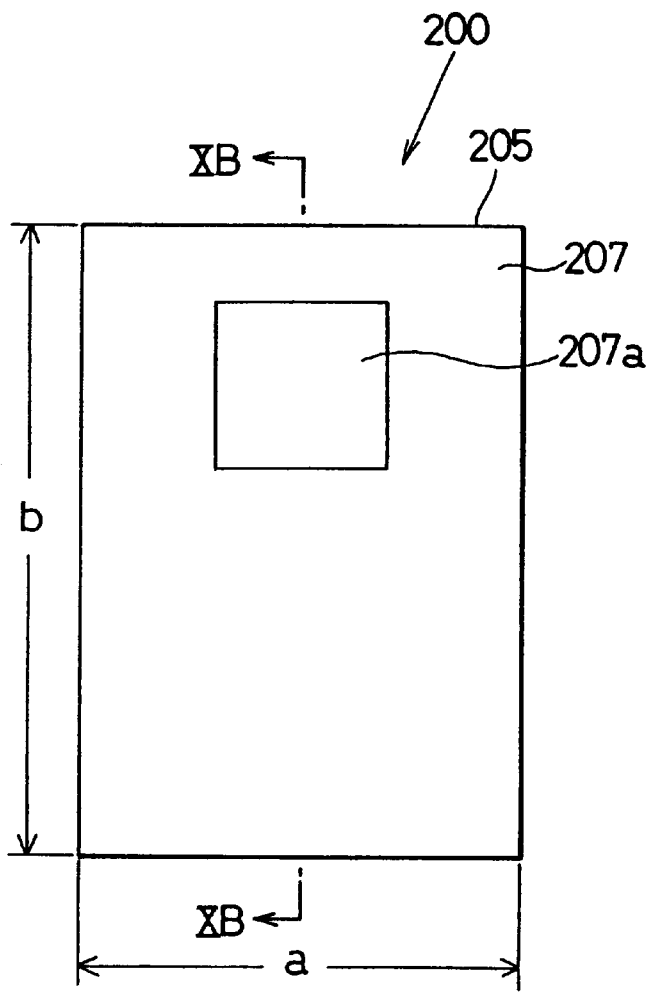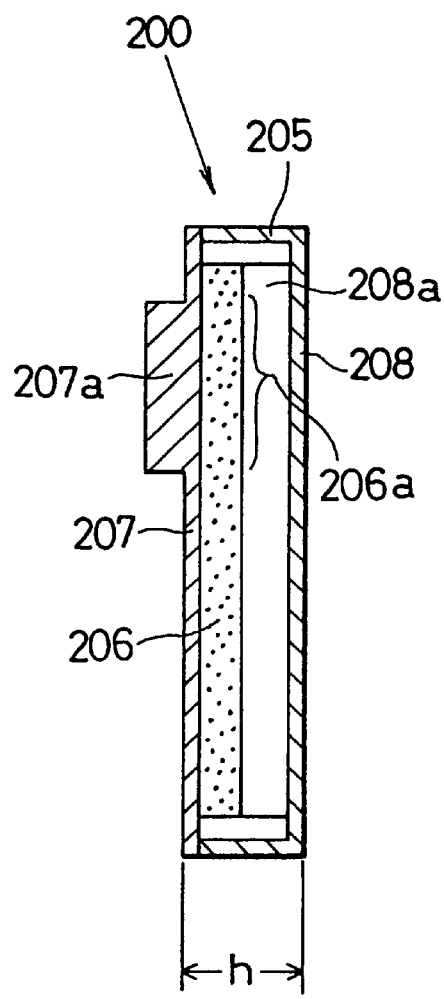

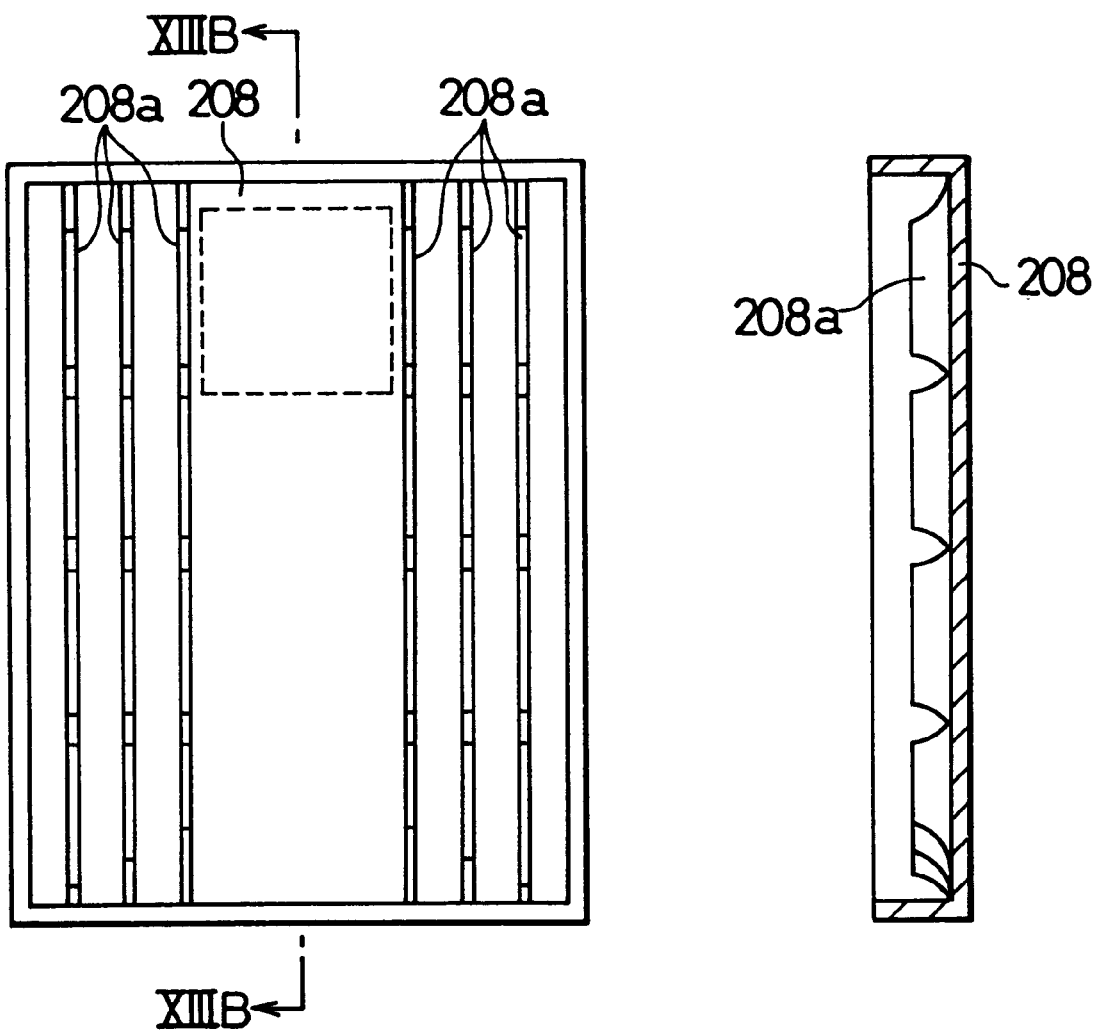

COOLING APPARATUS BY BOILING AND COOLING REFRIGERANT

CROSS REFERENCE TO RELATED APPLICATION

This application is based on Japanese Patent Application Nos. Hei. 10-142619 filed on May 25, 1998, Hei. 10-245483 filed on Aug. 31, 1998, and Hei. 11-141388 filed on May 21, 1999, the contents of which are incorporated herein by reference.

BACKGROUND OF THE INVENTION

1. Field of the Invention

The present invention relates to a cooling apparatus for cooling a heating body by evaporating and condensing refrigerant contained in a tank on which the heating body is attached.

2. Description of the Related Art

Conventionally, a cooling apparatus has a refrigerant tank storing refrigerant and a radiator mounted at the top of the refrigerant tank. The refrigerant having absorbed heat from the heating body and boiled in the refrigerant tank moves from the refrigerant tank to the radiator and is cooled by the radiator, and then condensed into a liquid. After that, the refrigerant returns to the refrigerant tank again. Heat emitted by the heating body is released to outside as latent heat of condensation as the refrigerant condenses at the radiator.

In recent years, due to a demand for portable terminals and the like, there has been a need for cooling apparatuses which can be used in any attitude. However, in the conventional cooling apparatus, it is a problem how to supply the refrigerant to the refrigerant tank. For example, when the cooling apparatus is used upside-down (i.e. with the refrigerant tank at the top and the radiator at the bottom), because the refrigerant is collectted in the radiator and cannot be supplied to the refrigerant tank, the cooling apparatus cannot be used for cooling.

In order to meet such a need, U.S. patent application "COOLING APPARATUS USING BOILING AND CONDENSING REFRIGERANT", Ser. No. 08/978,488, was filed on Nov. 25, 1997. This cooling apparatus is for cooling a CPU such as a semiconductor integrated circuit.

In the cooling apparatus, a refrigerant tank is formed from a sealed tank having a pair of faced walls; a heating body (CPU) is fixed on one wall (heat-receiving wall) of the sealed tank; a radiation fin is fixed on another wall (radiation wall); and a predetermined quantity of refrigerant is stored in the sealed tank. Heat emitted by the heating body is transferred through the heat-receiving wall to the refrigerant in the sealed tank, boils the refrigerant, and is released as a latent heat of condensation as the vapor refrigerant condenses on the radiation wall. The latent heat of condensation is emitted from the radiation wall through the radiation fin into the atmosphere.

Furthermore, the cooling apparatus is formed in a manner that a liquid level of the refrigerant is maintained above a heating body mounting portion at which the CPU is mounted so that the refrigerant is boiled at the heating body mounting portion, even when a side-heat situation that the CPU is mounted on a side wall of the sealed tank (i.e., a pair of wall described above is arranged vertically).

However, in the case of the side-heat situation, the whole area of the heating body mounting portion may not be soaked in the refrigerant, a boiling area may decrease, and then a superheat degree of the heating body mounting portion may increase. On the other hand, at the radiation wall side, much area of the radiation wall is soaked in the refrigerant, a condensing area may decrease, and then a supercool degree of the heat-receiving wall may increase.

SUMMARY OF THE INVENTION

Accordingly, an object of the present invention is to provide a cooling apparatus, which has high cooling capacity.

According to the present invention, when a heating body mounting portion is not arranged lower portion, refrigerant collected at the bottom of a tank is transported to an adjacent portion of the heating body mounting portion. That is, in a side-heat situation that the tank is arranged vertically, or in a top-heat situation that the heating body is arranged above the tank, refrigerant in the tank can be transported to the adjacent portion efficiently.

In addition, since the refrigerant is boiled at such a wide adjacent portion, a superheat degree of the heating body mounting portion can decrease due to an increase of a boiling refrigerant amount.

Furthermore, since the refrigerant collected at the bottom of the tank is transported to the adjacent portion by capillary action, an amount of the refrigerant to be contained in the tank can decrease. Hence, in the side-heat situation, the condensation area for condensing the vapor refrigerant becomes large, because an area of the radiation wall, which is soaked in the refrigerant, becomes small. Thus, a condensing refrigerant amount increases, and the supercool degree can decrease.

In this way, a cooling capacity of the cooling apparatus can increase because the superheat degree of the heating body mounting portion decreases and the supercool degree of the radiation wall decreases.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

FIG. 1A is a plan view of a cooling apparatus according to a first embodiment of the present invention;

FIG. 1B is a sectional view of the cooling apparatus taken along line IB—IB in FIG. 1A;

FIG. 10A is a plan view of a cooling apparatus according to the fifth embodiment;

FIG. 10B is a sectional view of the cooling apparatus taken along line XB—XB in FIG. 10A;

FIG. 13A is a plan view of a cooling apparatus according to a sixth embodiment;

FIG. 13B is a sectional view of the cooling apparatus taken along line XIIIB—XIIIB in FIG. 13A;

DETAILED DESCRIPTION OF THE PREFERRED EMBODIMENTS

Figure 2:
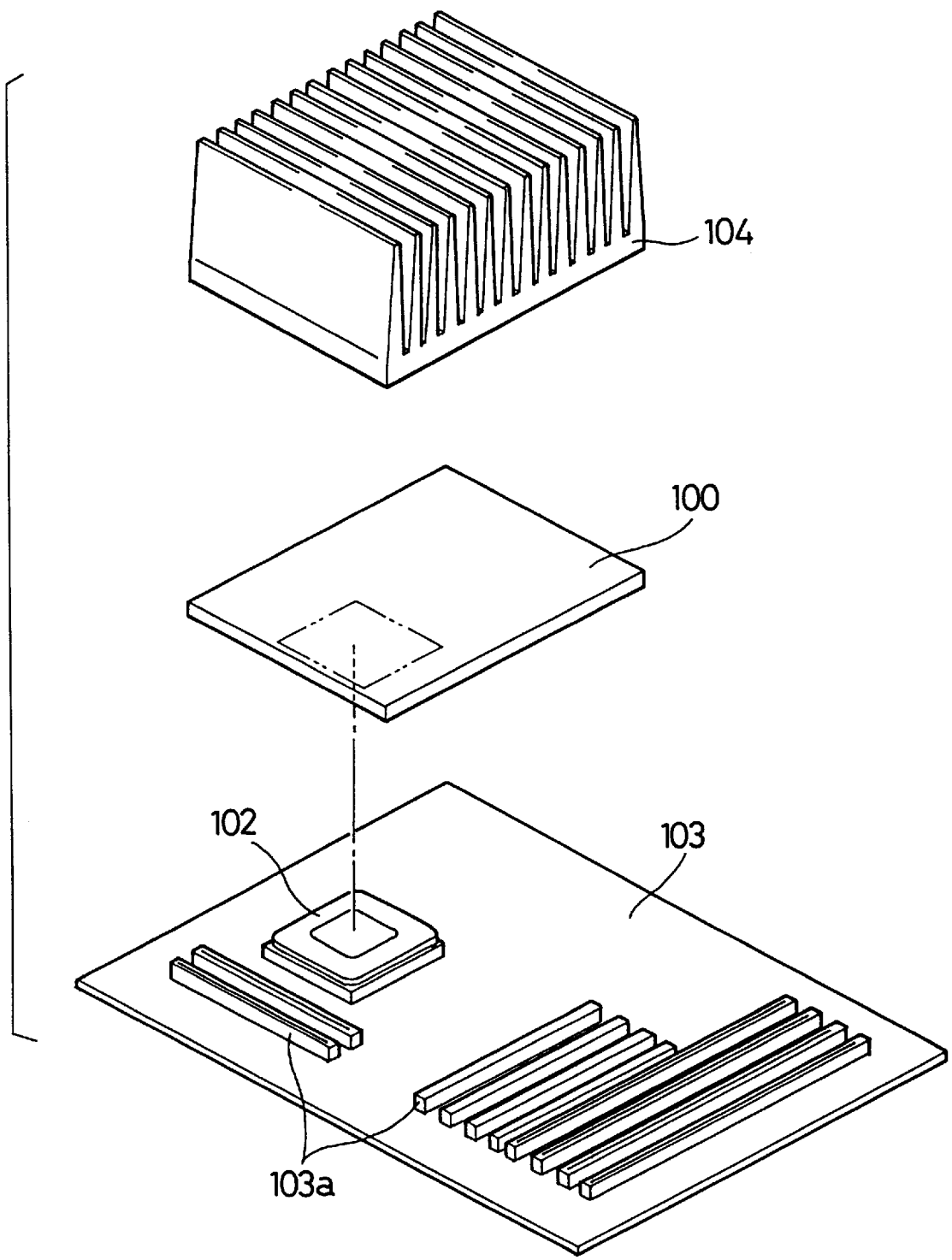
FIG. 2 is a perspective view illustrating an assembling way of the cooling apparatus according to the first embodiment.

Embodiments of the present invention will now be explained with reference to the drawings. In the drawings, corresponding portions among embodiments are labeled the same.

(First Embodiment)

A first embodiment will be explained with reference to FIGS. 1A, 1B, 2. As shown in FIG. 2, a cooling apparatus 100 cools a CPU 102 (heating body), which is mounted on such as a substrate of a computer, and is used by being inserted between the CPU 102 and a radiation fin 104.

As shown in FIGS. 1A and 1B, the cooling apparatus 100 has a tank 105 having a heating body mounting portion 107a, on which the CPU 102 is mounted; a porous metallic sintered body 106 arranged in the tank 105; and refrigerant (not shown) contained in the tank 105 by predetermined quantity.

The tank 105 is made of a metal having excellent heat conductivity (for example, copper, nickel, aluminum), and has shape of a flat box whose thickness dimension "h" is smaller than width dimension "a" and height dimension "b" as shown in FIGS. 1A, 1B.

The tank 105 has a pair of faced walls 107, 108. At one wall (hereinafter, heat-receiving wall) 107, the heating body mounting portion 107a is protrusively provided. At a whole area of another wall (hereinafter, radiation wall) 108, radiation fin 104 is mounted as shown in FIG. 2.

As shown in FIG. 2, since slots 103a are arranged on a substrate 103, an arrangement of the tank 105 is restricted. It is difficult to arrange the CPU 102 in a center portion of the heat-receiving wall 107. Hence, the heating body mounting portion 107a is arranged by offsetting from the center portion. In this embodiment, the center portion shows a gravity center of the heat-receiving wall 107, that is, a region where around an intersection between diagonal lines of the heat-receiving wall 107.

The cooling apparatus 100 is required to be used in any attitude. Therefore, it is required that the porous metallic sintered body 106 has a high refrigerant transportability enough to transport refrigerant collected at the bottom of the tank 105 to a region (hereinafter, adjacent portion) 106a adjacent to the heating body mounting portion 107a. Here, the adjacent portion 106a is one portion of the porous metallic sintered body 106, where the refrigerant is evaporated by receiving a heat from the heating body mounting portion 107a.

The porous metallic sintered body 106 is formed from a porous material made of a metal having excellent heat conductivity (for example, copper, nickel, aluminum), and functions as a wick that transports refrigerant collected at the bottom of the tank 105 to the adjacent portion 106a via a transportation portion of the metallic sintered body 106 by capillary action.

The porous metallic sintered body 106 has a predetermined void content and void diameter. Specifically, it is desired that the transportation portion has a void content of 50% or more and a void diameter within a range of 10–100 $\mu$m to achieve high capillary action. It is desired that the adjacent portion 106a has a void content of 20% or more and a void diameter within a range of 10–100 $\mu$m to reduce a superheat degree of the heating body mounting portion 107a.

As described above, the porous metallic sintered body 106 is desired to be manufactured so that each of the transportation portion and the adjacent portion 106a has suitable void content to have both a wick function and a superheat degree reducing function. The porous metallic sintered body 106 can be manufactured by the following method for instance. First, a porous metallic sintered body 106 having a void content of 50% or more and a void diameter of within a range of 10–100 $\mu$m is manufactured. Metallic particles or the like are buried in only the adjacent portion 106a, and then the adjacent portion 106a is sintered so that its void content is set to 20% or more. In this way, the porous metallic sintered body 106 comes to have both the wick function and the superheat degree reducing function.

The porous metallic sintered body 106 is formed from a plate member, which is as large as an inner surface of the heat-receiving wall 107, and is manufactured integrally with the heat-receiving wall 107. Then, heat received by the heating body mounting portion 107a is transported to the adjacent portion 106a with high efficiency.

On the contrary, at an inner surface of the radiation wall 108 of the tank 105, condensation fins 108a are manufactured integrally with the radiation wall 108. A fin pitch between each condensation fin 108a is set so that a condensation area is secured enough to reduce the supercool degree, and that a condensed refrigerant is not stagnated therebetween.

For the purpose of reducing a heat resistance in the cooling apparatus 100, it is desired that the heat-receiving wall 107, the radiation wall 108, and the porous metallic sintered body 106 are connected so as to obtain an excellent heat transfer therebetween. Specifically, each of the heat-receiving wall 107, the radiation wall 108, and the porous metallic sintered body 106 is bonded by thorough brazing, soldering or the like.

The refrigerant contained in the tank 105 is evaporated by heat emitted by the CPU 102, and is condensed on the radiation wall 108 that is cooled by air-cooling. The refrigerant is selected from a group of water, alcohol, acetone and other organic solvents based on an operation temperature range and a suitability for a material of the cooling apparatus 100. In this embodiment, refrigerant of copper-water family is used.

Figure 3:
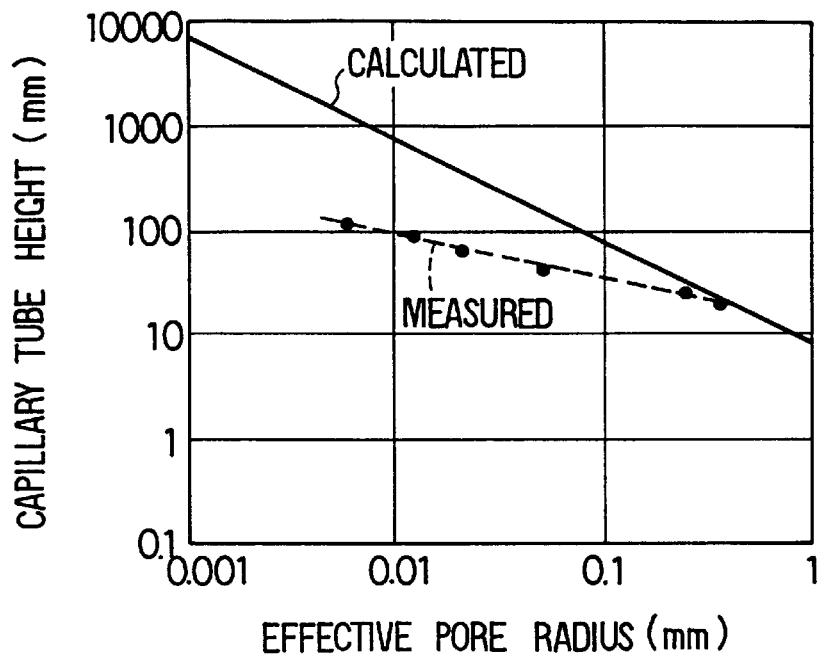
FIG. 3 is a graph illustrating a relation between an effective pore radius of a wick and a capillary tube height.

Here, when a size of the CPU 102 is around 50 mm×50 mm including a package, a base area size of the radiation fin 104 mounted on the CPU 2 is preferably 150 mm×150 mm. In this case, when the CPU 102 is bonded to the base area of the radiation fin 104 by offsetting from a center of the base area, it need to transport the refrigerant about 100 mm by the wick. Therefore, according to a graph in FIG. 3, when a capillary tube height is 100 mm, it is desired to set an effective pore radius to 0.01 mm or less. That is, it is desired to set an effective pore radius equal or less than a value, which corresponds to the capillary tube height (length) that the refrigerant needs to be transported.

Figure 4:
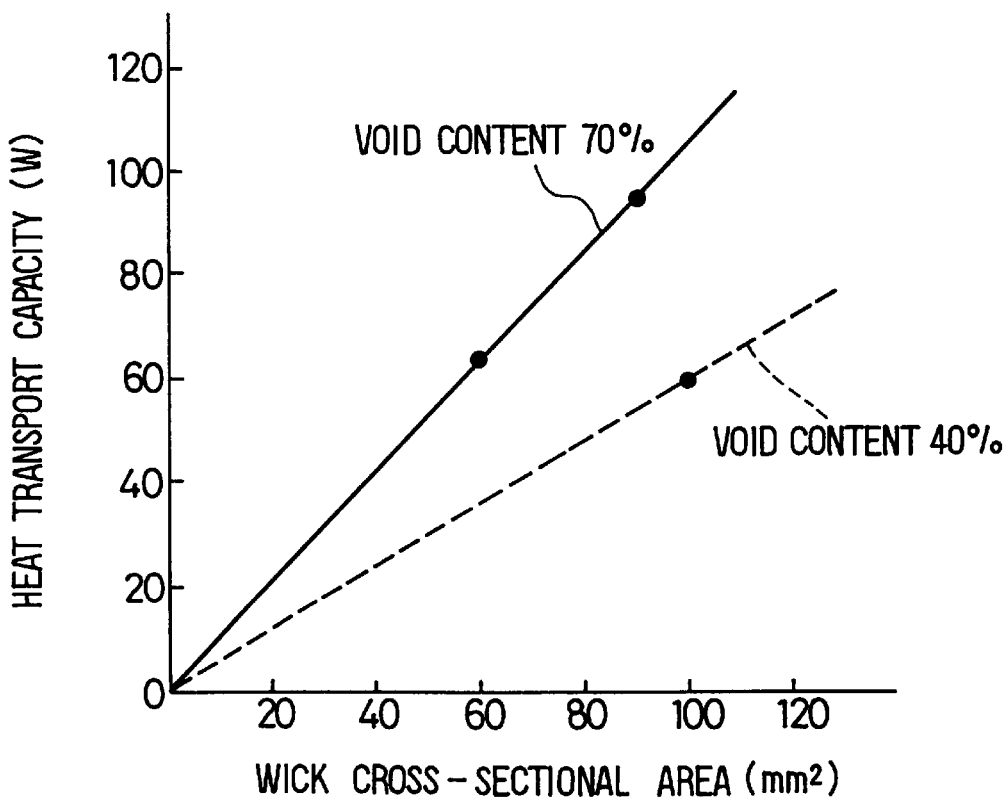
FIG. 4 is a graph illustrating a relation between a cross-sectional area of a metallic sintered wick and its heat transport capacity.

When a sintered metal is used as the wick, it is desired to set the effective pore radius to 0.01 mm or less, as described above. However, when the effective pore radius is equal, it is desired to have much space for a refrigerant passage so that the refrigerant is transported easily. According to FIG. 4, when a target heat transport capacity is 60 W, a wick cross-sectional area needs 100 mm² or more by a 40% void content wick. On the contrary, in case of the 70% void content wick, a wick cross-sectional area needs only 56 mm² or more. This value well corresponds to a needed passage cross-sectional area predictable as 57.14 mm², which is calculated by 100 mm²×(40%/70%). Therefore, the wick cross-sectional area can be reduced when the 70% void content wick is used (that is, the width of the tank 105 can be thinned down).

Figure 5:
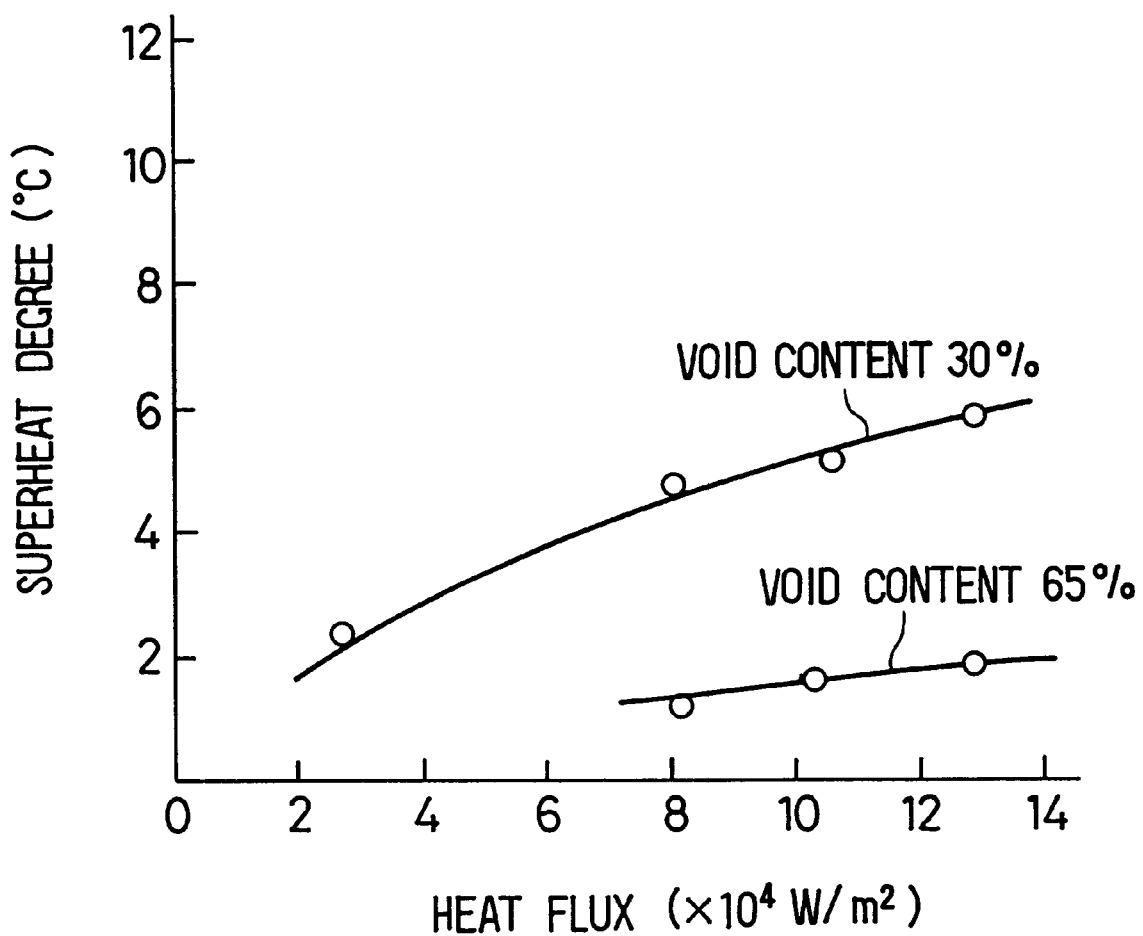
FIG. 5 is a graph illustrating a relation between a heat flux and a superheat degree.

When a surface covered with the sintered metallic wick is used as a boiling surface, the superheat degree can substantially reduce. Further, as shown in FIG. 5, a 60% void content wick can reduce the superheat to half or less of a 30% void content wick.

An operation of the cooling apparatus 100 will be explained.

Heat emitted by the CPU 102 is transferred to the adjacent portion 106a of the tank 105 through the heating body mounting portion 107a, and then boils the refrigerant transported to the adjacent portion 106a. A vapor refrigerant, which is generated as a result of boiling, is condensed and liquefied by emitting a latent heat of condensation to the condensation fin 108a and the radiation wall 108, which is maintained to low temperature by the radiation fin 104, and then returns to the bottom of the tank 105 as a liquid drop. The heat emitted to the radiation wall 108 is emitted to the atmosphere via the radiation fin 104 mounted on the radiation wall 108.

According to the above-mentioned cooling apparatus 100, the refrigerant collected at the bottom of the tank 105 is transported to the adjacent portion 106a by the capillary action of the porous metallic sintered body 106. Therefore, the heating body mounting portion 107a is offset from the center portion of the heat-receiving wall 107. Furthermore, even in the side-heat situation shown in FIG. 1A, 1B, the refrigerant in the tank 105 can be transported to the adjacent portion 106a without fail by the capillary action of the porous metallic sintered body 106. In addition, since the refrigerant is boiled at such a wide region, that is the adjacent portion 106a, the superheat degree of the heating body mounting portion 107a can decrease due to increase of refrigerant amount.

Furthermore, since the refrigerant collected at the bottom of the tank 105 is transported to the adjacent portion 106a by the capillary action, an amount of the refrigerant to be contained in the tank 105 can decrease. Hence, in the side-heat situation, the condensation area for condensing the vapor refrigerant becomes large, because an area of the radiation wall 108 soaked in the refrigerant becomes small. Therefore, a condensing refrigerant amount increases, and the supercool degree can decrease.

In this way, a cooling capacity of the cooling apparatus 100 can increase because the superheat degree of the heating body mounting portion 107a decreases and the supercool degree of the radiation wall 108 decreases.

Furthermore, the cooling apparatus 100 is made up of substantially the tank 105, the porous metallic sintered body 106 and the refrigerant. Since,the cooling apparatus 100 can be formed simply, a productivity of the cooling apparatus increase, and a manufacturing cost of the cooling apparatus is reduced.

(Second Embodiment)

Second embodiment will be explained with reference to FIGS. 6A–6C. Here, each of FIGS. 6A–6C shows different cooling apparatus, respectively.

In this embodiment, a heat transfer member 110 is protrusively provided inside of the heating body mounting portion 107a to reduce the superheat degree of the heating body mounting portion 107a of the heat-receiving wall 107. The heat transfer member 110 is integrally formed with the heat-receiving wall 107, and is protruded into the porous metallic sintered body 106, for transferring heat received by the heating body mounting portion 107a to inside of the porous metallic sintered body 106. That is, the heat transfer member 110 improves a heat conductivity to the porous metallic sintered body 106, enlarges a heat transfer area, reduces a heat flux at the heating body mounting portion 107a, and reduces the superheat degree of the heating body mounting portion 107a.

Figure 6A:
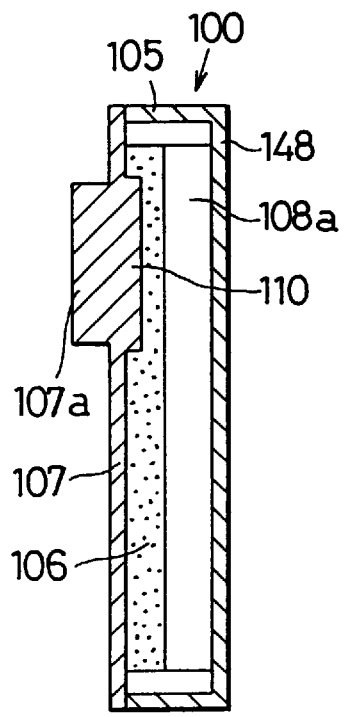
FIGS. 6A–6C are sectional views of cooling apparatuses according to a second embodiment of the present invention.
Figure 6B:
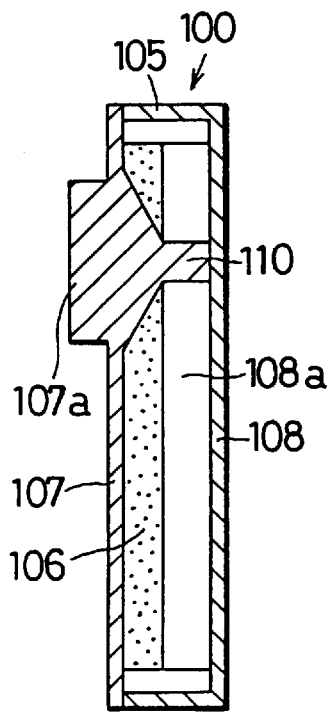
Figure 6C:
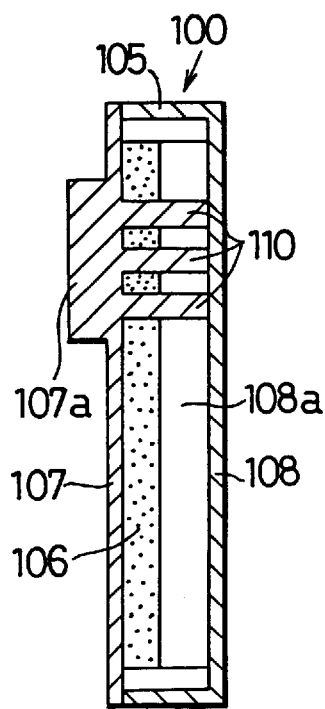

Here, FIG. 6A shows a cooling apparatus that the heat transfer member 110 is protruded into the porous metallic sintered body 106. FIGS. 6B, 6C show cooling apparatuses that the heat transfer member 110 is penetrated the porous metallic sintered body 106, and is contacted with the radiation wall 108. According to FIGS. 6B, 6C, since heat is directly transferred to the radiation wall 108 to radiate, the superheat degree of the heating body mounting portion 107a is further reduced. Here, it is desired for the heat transfer member 110 to have plurality of pole members as shown in FIG. 6C.

Furthermore, since the heat transfer member 110 is contacted with the radiation wall 108, strength of the tank improves, and it can avoid deforming of the tank 105.

(Third Embodiment)

Figure 7A:
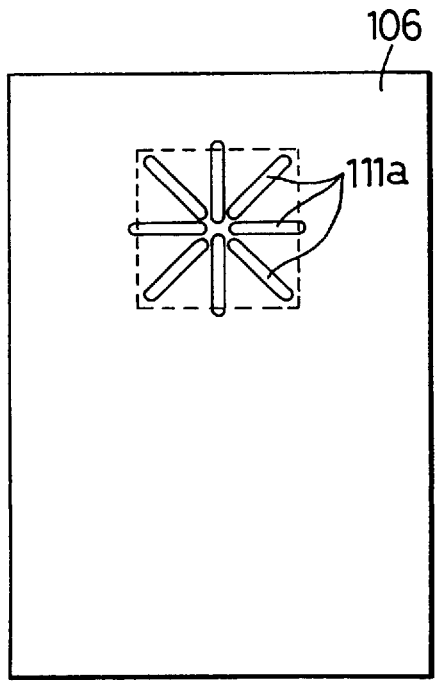
FIGS. 7A–7B are plan views of porous metallic sintered bodies of cooling apparatuses according to a third embodiment of the present invention.
Figure 7B:
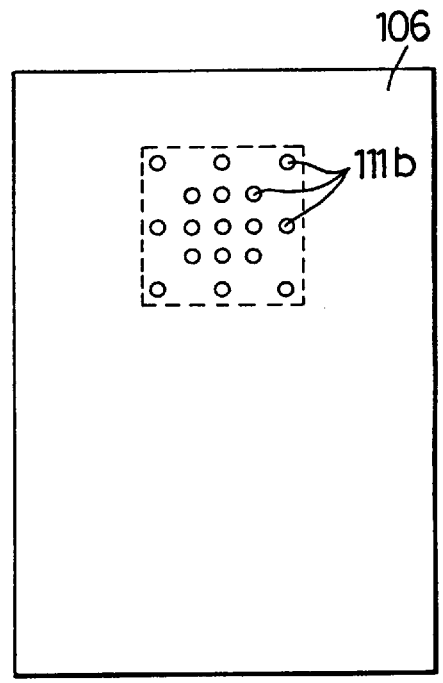

Third embodiment will be explained with reference to FIGS. 7A, 7B. Here, each of FIGS. 7A, 7B shows different cooling apparatus, respectively.

In this embodiment, pluralities of grooves 111a (FIG. 7A) or pluralities of holes 111b (FIG. 7B) are provided to reduce the superheat degree of the heating body mounting portion 107a of the heat-receiving wall 107. Here, the grooves 111a or the holes 111b may penetrate the porous metallic sintered body 106 or may be a hollow formed on a surface of the porous metallic sintered body 106. The grooves 111a or the holes 111b enlarge a heat transfer area, facilitate permeation of the vapor refrigerant, decrease a flow-velocity of the vapor refrigerant facing a flow of the liquid refrigerant, and reduce the superheat degree of the heating body mounting portion 107a.

(Fourth Embodiment)

Fourth embodiment will be explained with reference to FIGS. 8A, 8B. Here, each of FIGS. 8A, 8B shows different cooling apparatus, respectively.

Figure 8A:
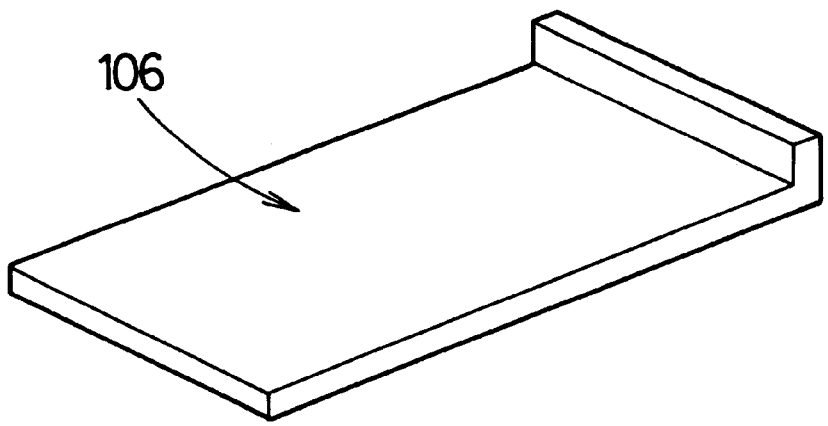
FIGS. 8A–8B are perspective views of porous metallic sintered bodies of cooling apparatuses according to a fourth embodiment of the present invention.
Figure 8B:
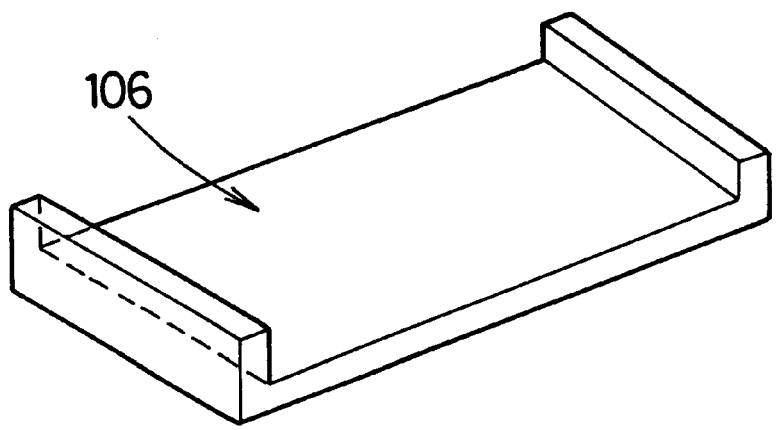

FIGS. 8A, 8B show the porous metallic sintered bodies 106, which can be used in any attitude. The porous metallic sintered body 106 is formed to L-shape (FIG. 8A) or U-shape (FIG. 8B) so that one part of the porous metallic sintered body 106 is always soaked in the refrigerant at the bottom of the tank 105. Hence, the porous metallic sintered body 106 is arranged along the inner surface of the heating body mounting portion of the tank 105 (inner surface of the heat-receiving wall 107) and the other inner surface of the tank 105.

The L-shaped porous metallic sintered body 106 may be manufactured by using an L-shaped mold. Further, it may be manufactured by the following steps. When the porous metallic sintered body 106 is integrally formed with the heat-receiving wall 107, stripping agent is applied to a predetermined region of the heat-receiving wall 107. After sintering, the predetermined region of the porous metallic sintered body 106 is raised up by stripping.

(Modified Embodiment)

In the above-mentioned embodiments, the heating body mounting portion 107a is protruded into the heat-receiving wall 107, however, whole the heat-receiving wall 107 may be flat (the heating body mounting portion 107a may be not protruded into the heat-receiving wall 107). Furthermore, the heating body mounting portion 107a may be made up of a recess formed on the surface of the heat-receiving wall 107.

(Fifth Embodiment)

Fifth embodiment will be explained with reference to FIGS. 9A–9F, 10A, 10B, 11, and 12A–12C.

As shown in FIG. 10B, the cooling apparatus 200 has a tank 205 having a heating body mounting portion 207a, on which a CPU 202 is mounted; a main wick 206 arranged in the tank 205; and refrigerant (not shown) contained in the tank 205 by predetermined quantity.

The tank 205 is made of a metal having excellent heat conductivity (for example, copper, nickel, aluminum), and has shape of a flat box whose thickness dimension "h" is smaller than width dimension "a" and height dimension "b" as shown in FIGS. 10A, 10B.

The tank 205 has a pair of faced walls 207, 208. At one wall (hereinafter, heat-receiving wall) 207, the heating body mounting portion 207a is protrusively provided. On a whole area of another wall (hereinafter, radiation wall) 208, radiation fin 204 is mounted as shown in FIG. 11.

Figure 11:
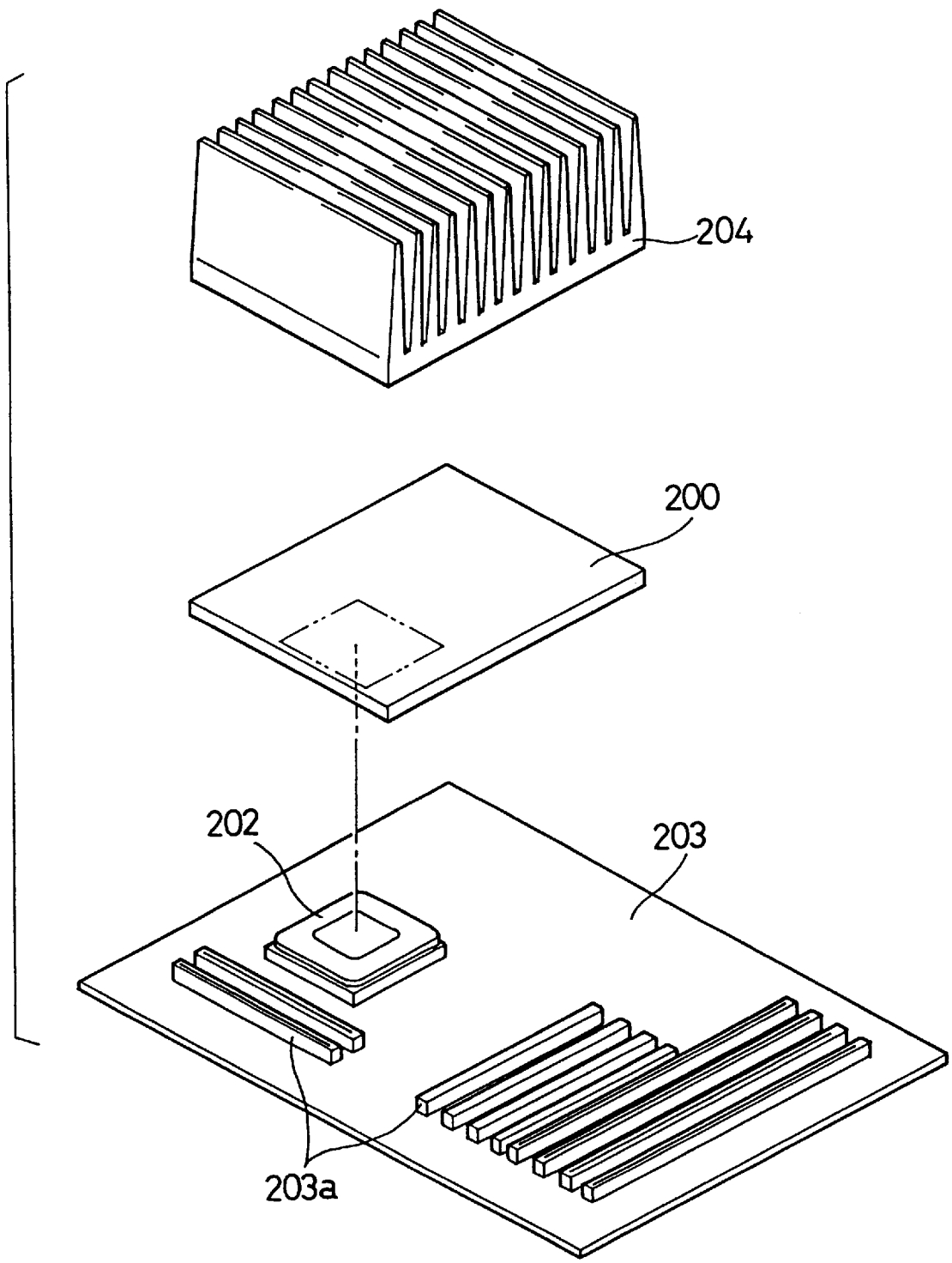
FIG. 11 is a perspective view illustrating an assembling way of the cooling apparatus according to the fifth embodiment.

As shown in FIG. 11, since slots 203a are arranged on a substrate 203, an arrangement of the tank 205 is restricted. It is difficult to arrange the CPU 202 in a center portion of the heat-receiving wall 207. Hence, the heating body mounting portion 207a is arranged by offsetting from the center portion. In this embodiment, the center portion shows a gravity center of the heat-receiving wall 207, that is, a region around an intersection between diagonal lines of the heat-receiving wall 207.

The refrigerant contained in the tank 205 is evaporated by heat emitted by the CPU 202, and is condensed by air-cooling. The refrigerant is selected from a group of water, alcohol, acetone and other organic solvent based on an operation temperature range and a suitability for a material of the cooling apparatus 200. In this embodiment, refrigerant of copper-water family is used.

The cooling apparatus 200 is required to be used in any attitude. Therefore, it is required that the main wick 206 has a high refrigerant transportability enough to transport refrigerant collected at the bottom of the tank 205 to a region (hereinafter, adjacent portion) 206a adjacent to the heating body mounting portion 107a. Here, the adjacent portion 206a is one portion of the main wick 206, where the refrigerant is evaporated by receiving a heat from the heating body mounting portion 207a.

The main wick 206 transports the refrigerant collected at the bottom of the tank 205 to the adjacent portion 206a by the capillary action, and is made of a porous metallic sintered body that is the same material, void content and void radius of the porous metallic sintered body 106 of the First embodiment. The porous metallic sintered body is formed from a porous material made of a metal having excellent heat conductivity (for example, copper, nickel, aluminum), and is bonded to the tank 205 by brazing, soldering or the like to reduce a heat resistance in the cooling apparatus 200. Here, the main wick may be made of such as metallic gauze, metallic fiber or non-metallic fiber (e.g., carbon fiber or glass fiber).

As shown in FIGS. 9A–9F, on the inner surface of the radiation wall 208, which faces the heat-receiving wall 207, plurality of condensation fins 208a are provided. Here, each of FIGS. 9A–9F shows different inner surface of the radiation wall 208, respectively. That is, these figures show fin-arrangement including an example that an edge of a fin line is arranged into reversed V-shape, and an example that fin lengths decrease as closer to the center of a vapor passage.

Figure 9A:
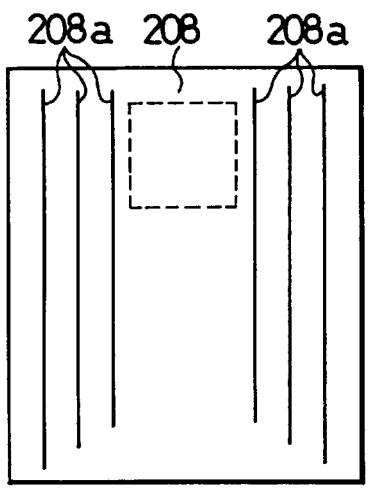
FIGS. 9A–9F are inside plan views of radiation walls illustrating arrangement of condensation fins according to a fifth embodiment of the present invention.
Figure 9D:
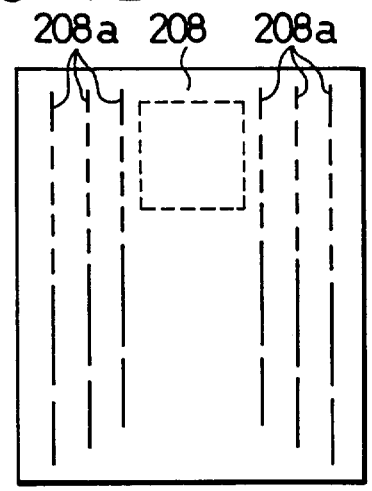
Figure 9B:
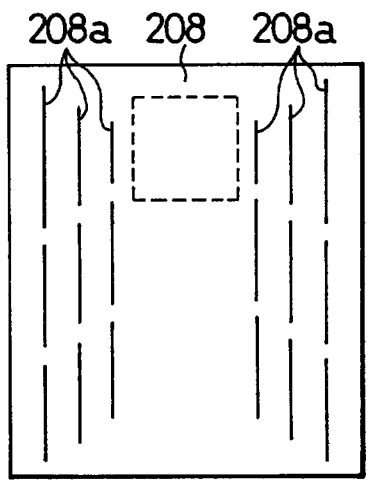
Figure 9E:
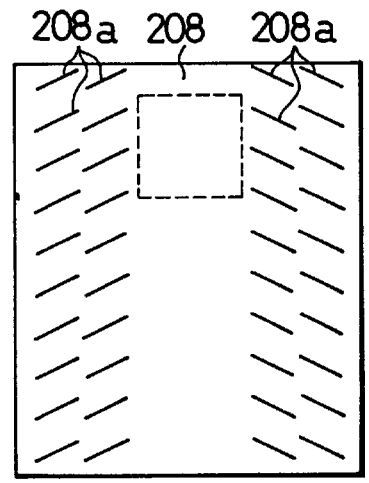
Figure 9C:
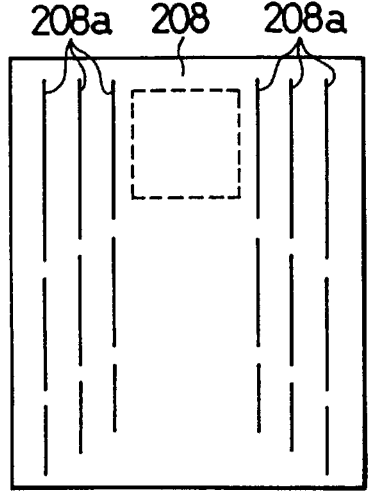
Figure 9F:
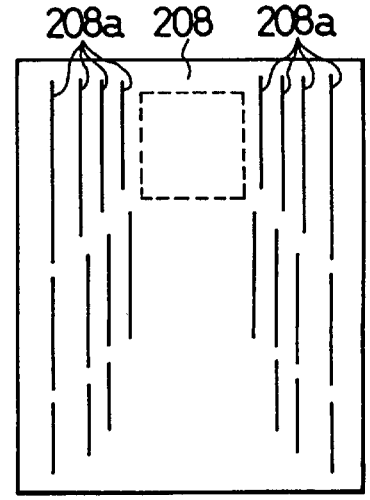

As shown in FIG. 9A, each condensation fin 208a may be arranged in parallel, without dividing, and the fin lengths may decrease as closer to the center of the vapor passage. As shown in FIGS. 9B, 9C, each line of condensation fin 208a of FIG. 9A may be divided into plural (e.g., three) fins. The fin lengths of the divided condensation fins 208a may decrease as closer to the center of the vapor passage. As shown in FIG. 9D, a divided number of the condensation fin 208a may be increased at a region adjacent to the adjacent portion 206a. As shown in FIG. 9E, the condensation fins 208a may be obliquely arranged with respect to a longitudinal direction of the tank 205. As shown in FIG. 9F, fin pitches may not be equal each other (i.e., unequal fin pitch).

Figure 12A:
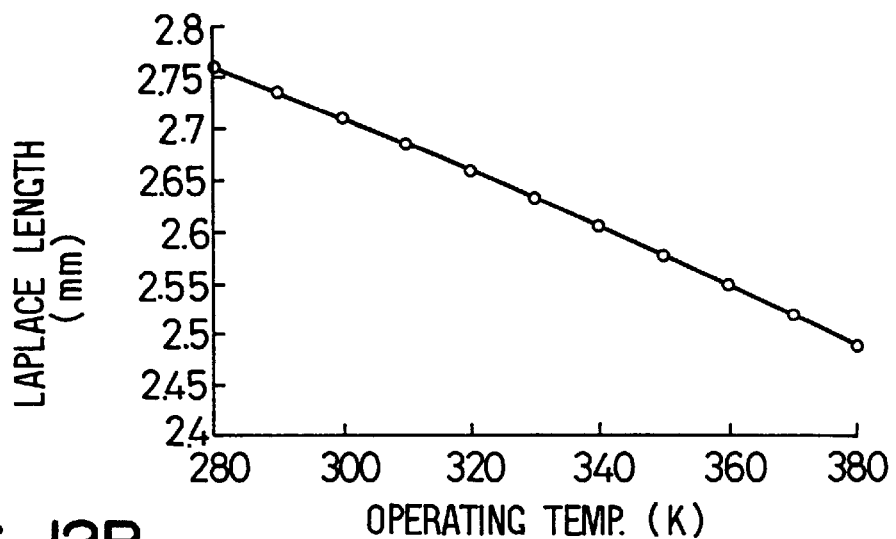
FIG. 12A is a graph illustrating a relation between operating temperature and a Laplace length.
Figure 12B:
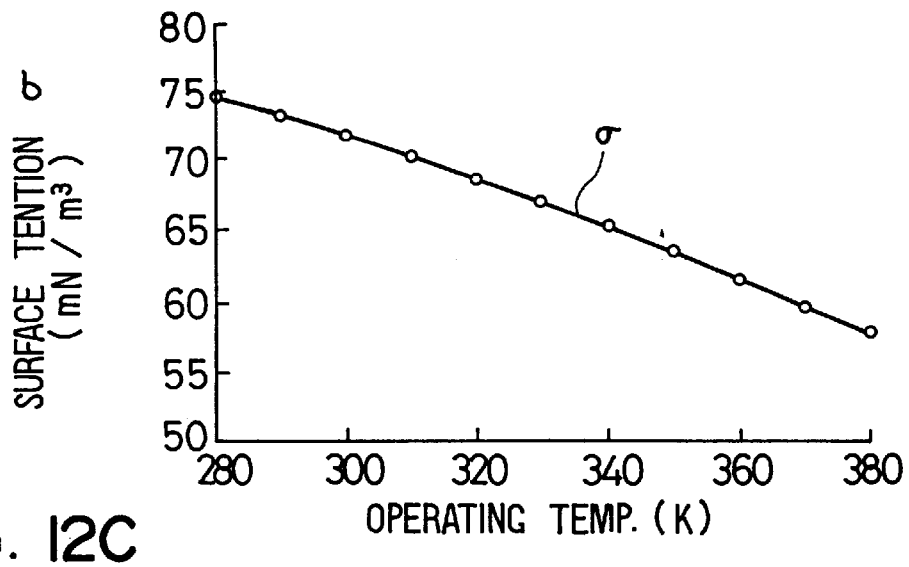
FIG. 12B is a graph illustrating a relation between operating temperature and a surface tension.
Figure 12C:
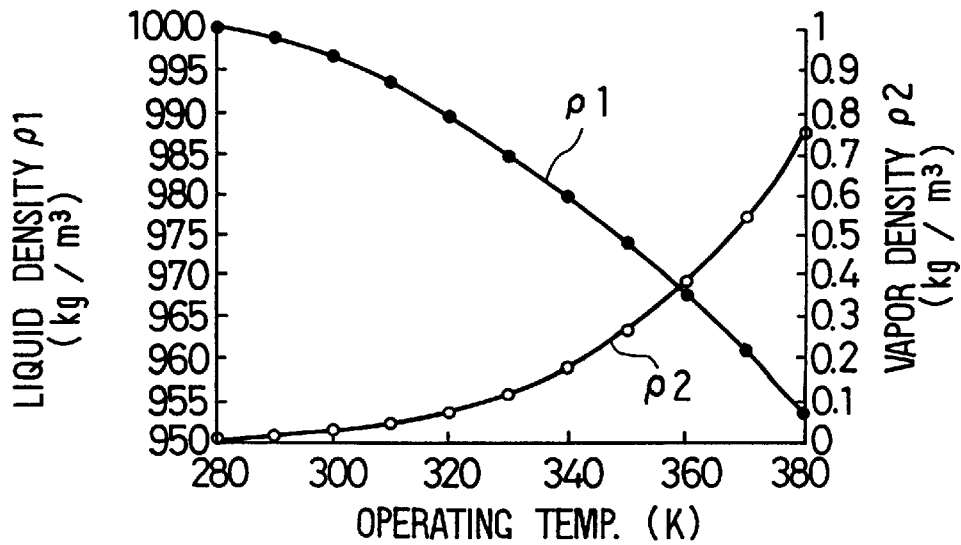
FIG. 12C is a graph illustrating both a relation between operating temperature and a liquid density, and a relation between operating temperature and a vapor density.

The condensation fin 208a is thermally connected to the radiation wall 208, and its fin pitch is set to a Laplace length or more so that it secures a necessary condensation area for reducing the supercool degree, and that the liquid refrigerant is not bridged between adjacent condensation fins during an operation temperature range. Here, relations between the operation and the Laplace length, a surface tension, a liquid density, and a vapor density are shown in FIGS. 12A–12C.

Here, the Laplace length is defined by the following equation.

$$\text{LAPLASE LENGTH} = a \times \sqrt{\frac{\sigma}{g(\rho 1 - \rho 2)}}$$

Here, "a" represents a coefficient depends on the refrigerant (e.g., water:a=0.8–1.5; fleon:a=0.5–1.0), "σ" represents the surface tension of the liquid refrigerant, "ρ1" represents the liquid refrigerant density, "ρ2" represents the vapor refrigerant density, and "g" represents the gravitational acceleration.

An operation of the cooling apparatus will be explained.

Heat emitted by the CPU 202 is transferred to the adjacent portion 206a of the tank 205 through the heating body mounting portion 207a, and then boils the refrigerant transported to the adjacent portion 206a. A vapor refrigerant, which is generated as a result of boiling, is condensed and liquefied by emitting a latent heat of condensation to the condensation fin 108a and the radiation wall 208, which is maintained to low temperature by the radiation fin 204, and then returns to the bottom of the tank 205 as a liquid drop. The heat emitted to the radiation wall 208 is emitted to the atmosphere via the radiation fin 204 mounted on the radiation wall 208.

According to the cooling apparatus of this embodiment, since the fin pitch of the condensation fin 208a is set to a Laplace length or more, it can avoid the liquid refrigerant from being bridged between adjacent condensation fins during operation.

Therefore, it can avoid a decreasing of radiation capacity of the condensation fins 208a due to the bridge of the liquid refrigerant, and the condensation fins 208a can radiate efficiently. Consequently, the cooling capacity of the cooling apparatus 200 can increase.

According to the above-mentioned cooling apparatus 200, the refrigerant collected at the bottom of the tank 205 is transported to the adjacent portion 206a by the capillary action of the main wick 206. Therefore, the heating body mounting portion 207a is offset from the center portion of the heat-receiving wall 207. Furthermore, even in the side-heat situation shown in FIG. 10A, 10B, the refrigerant in the tank 205 can be transported to the adjacent portion 206a without fail by the capillary action of the main wick 206. In addition, since the refrigerant is boiled at such a wide region, that is the adjacent portion 206a, the superheat degree of the heating body mounting portion 207a can decrease due to increase of refrigerant amount.

Furthermore, since the refrigerant collected at the bottom of the tank 205 is transported to the adjacent portion 206a by the capillary action, an amount of the refrigerant to be contained in the tank 205 can decrease. Hence, in the side-heat situation, the condensation area for condensing the vapor refrigerant becomes large, because an area of the radiation wall 208 soaked in the refrigerant becomes small. Therefore, a condensing refrigerant amount increases, and the supercool degree can decrease.

In this way, a cooling capacity of the cooling apparatus 200 can increase because the superheat degree of the heating body mounting portion 207a decreases and the supercool degree of the radiation wall 208 decreases.

Furthermore, the cooling apparatus 200 is made up of substantially the tank 205, the main wick 206 and the refrigerant. Since, the cooling apparatus 200 can be formed simply, a productivity of the cooling apparatus increase, and a manufacturing cost of the cooling apparatus is reduced.

(Sixth Embodiment)

Sixth embodiment will be explained with reference to FIGS. 13A, 13B. FIG. 13A shows the inner surface of the radiation wall 208, and FIG. 13B is a sectional view taken along line XIIIB—XIIIB in FIG. 13A.

In this embodiment, each of the condensation fins 208a is divided into plurality of divided fins, and a height of each fin edge of the divided fins is continually reduced. In this embodiment, the fin edge is formed circular arc shape, as shown in FIG. 13B.

Since such a divided condensation fin 208a is provided, it can restrain to grow a liquid drop or a bubble of the refrigerant deposited on the condensation fin 208a. Since the height of the fin edge is continually reduced, the condensed refrigerant deposited on the condensation fin 208a can be drained smoothly. In this way, since the drain of the condensed refrigerant deposited on the condensation fin 208a is facilitated, the heat resistance of the condensation fin 208a is reduced, and then the cooling capacity of the cooling apparatus 200 can improve.

(Seventh Embodiment)

Figure 14A:
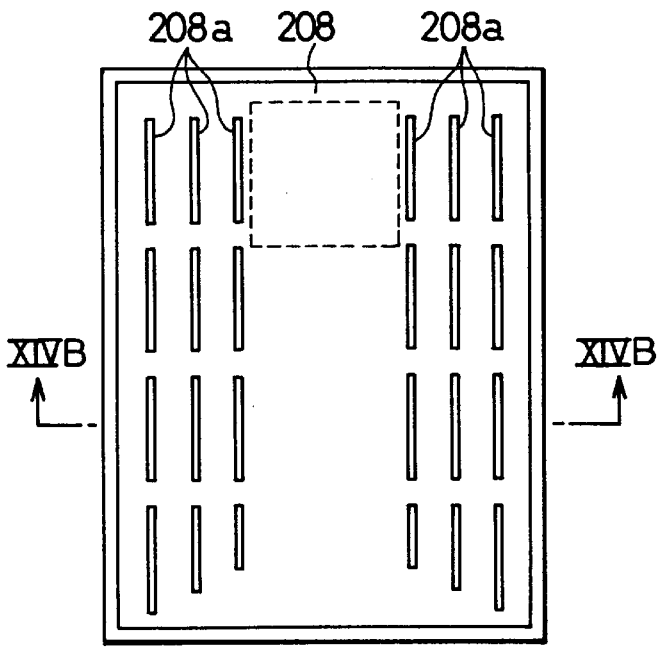
FIG. 14A is an inside plan view of a cooling apparatus according to a seventh embodiment.
Figure 14B:
FIG. 14B is a sectional view of the cooling apparatus taken along line XIVB—XIVB in FIG. 14A.

Seventh embodiment will be explained with reference to FIGS. 14A, 14B. FIG. 14A shows the inner surface of the radiation wall 208, and FIG. 14B is a sectional view taken along line XIVB—XIVB in FIG. 14A.

In this embodiment, each side of the each divided condensation fin 208a has oblique surfaces from the condensation fin 208a to the radiation wall 208. The oblique surface is formed to have a circular-arc shaped cross section, as shown in FIG. 14B. This structure is easily formed by integrally forming the radiation wall 208 and the condensation fins 208a by using a molding technique such as an extrusion, a drawing or a cold forging.

Since such a divided condensation fin 208a is provided, it can restrain to grow a liquid drop or a bubble of the refrigerant deposited on the condensation fin 208a. Since each side of the each divided condensation fin 208a has oblique surfaces from the condensation fin 208a to the radiation wall 208, it can further restrain to grow a liquid drop or a bubble of the refrigerant deposited on the condensation fin 208a. In this way, since the drain of the condensed refrigerant deposited on the condensation fin 208a is facilitated, the heat resistance of the condensation fin 208a is reduced, and then the cooling capacity of the cooling apparatus 200 can improve.

(Eighth Embodiment)

Figure 15:
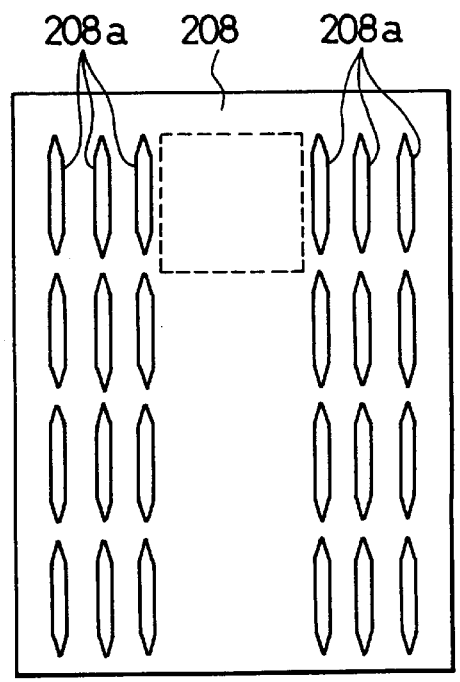
FIG. 15 is an inside plan view of a cooling apparatus according to an eighth embodiment.

Eighth embodiment will be explained with reference to FIGS. 15. FIG. 15 shows the inner surface of the radiation wall 208. In this embodiment, a fin edge of the divided condensation fins 208a is thinned down to be sharpened (tapered).

Since such a divided condensation fin 208a is provided, it can restrain to grow a liquid drop or a bubble of the refrigerant deposited on the condensation fin 208a. Since each fin edge of the divided condensation fins 208a is thinned down to be sharpened, it can further restrain to grow a liquid drop or a bubble of the refrigerant deposited on the condensation fin 208a. In this way, since the drain of the condensed refrigerant deposited on the condensation fin 208a is facilitated, the heat resistance of the condensation fin 208a is reduced, and then the cooling capacity of the cooling apparatus 200 can improve.

(Ninth Embodiment)

Ninth embodiment will be explained with reference to FIGS. 16A–16D. Here, each of FIGS. 16A–16D shows sectional views of different cooling apparatuses 200, respectively.

In this embodiment, an auxiliary wick 209, which is made of material having an excellent transportability of the refrigerant, is provided to at least one of the radiation wall 208 and the condensation fin 208a. This auxiliary wick 208 facilitates a drain of the condensed refrigerant and reduces the supercool degree of the radiation wall 208.

Figure 16A:
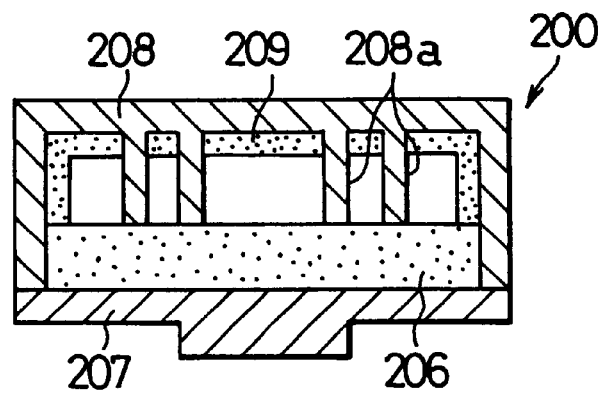
FIGS. 16A–16D are sectional views of cooling apparatuses according to a ninth embodiment.
Figure 16B:
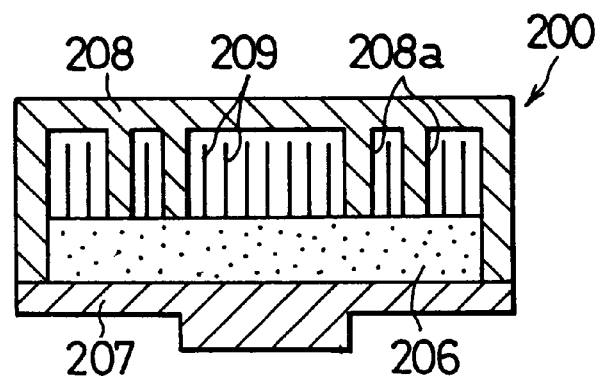
Figure 16C:
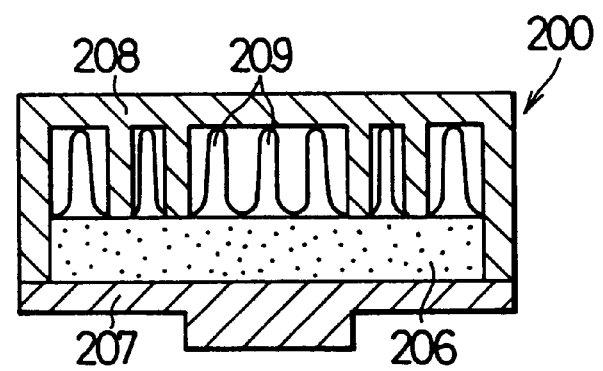
Figure 16D:
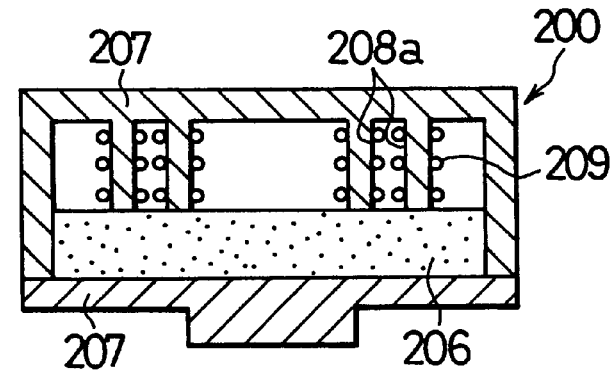

The auxiliary wick 209 may be made of one of a porous material such as a porous sintered metal as shown in FIG. 16A; a metallic fiber or a metallic gauze as shown in FIG. 16B; a non-metallic fiber such as a carbon fiber or a glass fiber as shown in FIG. 16C; or a metallic wire as shown in FIG. 16D.

Here, when the auxiliary wick 209 is contacted to the main wick 206, the liquid refrigerant transported by the auxiliary wick 209 is directly supplied to the main wick 206, and then a total route to transport the refrigerant is shortened. Hence, the refrigerant circulates efficiently, and the cooling capacity of the cooling apparatus can increase.

(Tenth Embodiment)

Tenth embodiment will be explained with reference to FIGS. 17A–17D. Each of FIGS. 17A–17D shows inner surfaces of different radiation walls 208.

In this embodiment, a shape of the condensation fin 208a is changed to provide a control passage 210 that controls the vapor refrigerant flow. The control passage 210 diffuses the vapor refrigerant flow to the whole space inside the cooling apparatus 200 (i.e., a space between the main wick 206 and the radiation wall 208). Hence, the condensation fin 208a and the radiation wall 208 can be used efficiently, and then the supercool degree of the radiation wall 208 can be reduced.

Figure 17A:
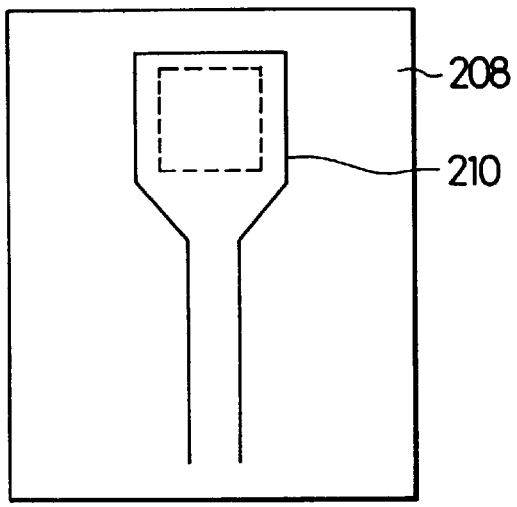
FIGS. 17A–17D are inside plan views of radiation walls according to a tenth embodiment of the present invention.

As shown in FIG. 17A, the control passage 210 may have a enlarged portion around the adjacent portion 206a and a vertical portion to guide the vapor refrigerant generated around the adjacent portion 206a to lower part of the tank 205.

Figure 17C:
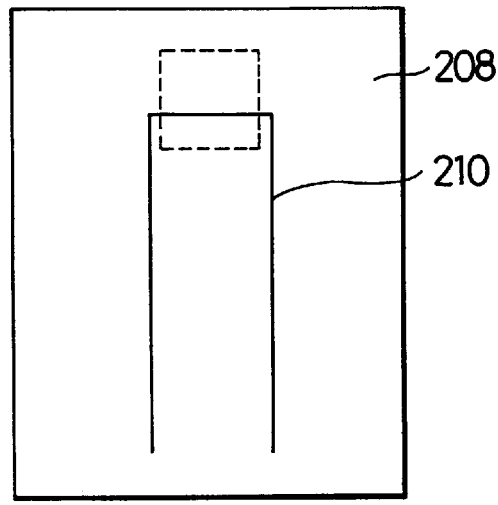
Figure 17B:
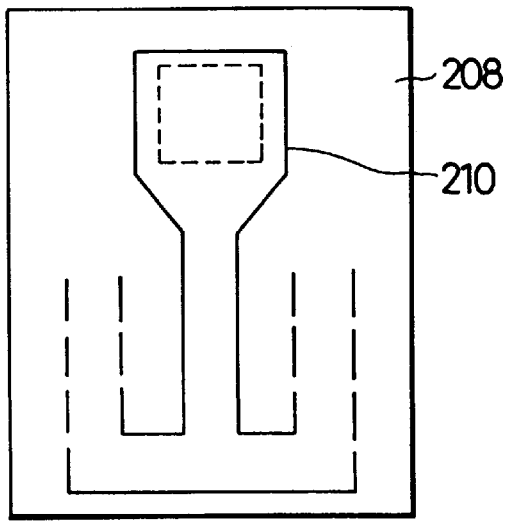

As shown in FIG. 17B, the control passage 210 shown in FIG. 17A may have further a horizontal portion to guide the vapor refrigerant guided to the lower part of the tank 205 to both side of the tank 205.

As shown in FIG. 17C, the enlarged portion and the vertical portion may have same widths (i.e., U-shape). Lower half area of the adjacent portion 206a is in the control passage, upper half area of the adjacent portion 206a is out of the control passage. In this case, the vapor refrigerant generated at the lower half area of the adjacent portion 206a is guided to the lower part of the tank 205, and that generated at the upper half area of the adjacent portion 206a is guided to the upper part of the tank 205.

Figure 17D:
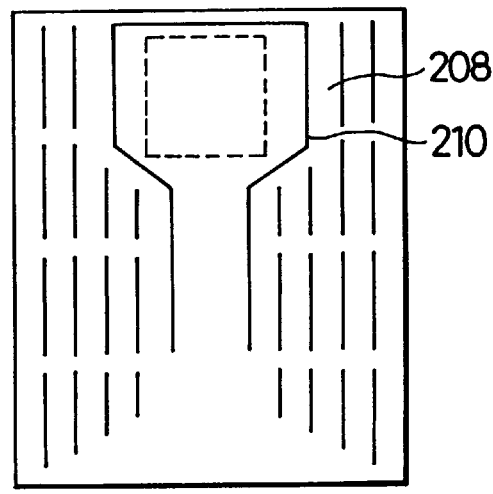

As shown in FIG. 17D, the control passage 210 shown in FIGS. 17A–17C may be used with the condensation fin 208a shown in FIGS. 9A–9F, 13A, 13B, 14A, 14B, and 15.

(Modified Embodiment)

Hydrophilic process may be applied to at least one of the radiation wall 208 and condensation fin 208a to form a hydrophilic coat on its surface. Furthermore, Fine groove process may be applied to at least one of the radiation wall 208 and condensation fin 208a to form a fine groove on its surface. It is desired that a width of the fine groove is 200 $\mu$m or less, and that a ratio of (depth/width) is 1 or more.

Since at least one of the hydrophilic coat and the fine groove is formed on at least one of the radiation wall 208 and condensation fin 208a, the condensed refrigerant deposited on the condensation fin 208a can be drained smoothly. Hence, the heat resistance of the condensation fin 208a is reduced, and then the cooling capacity of the cooling apparatus 200 can improve.

What is claimed is:

1. A cooling apparatus for boiling and condensing refrigerant, comprising:
   a tank for containing refrigerant therein, the tank having a heating body mounting portion to mount a heating body thereon, a heat-receiving wall, a radiation wall, and a vapor passage through which a vapor refrigerant flows;
   a wick disposed in the tank for transporting the refrigerant to an adjacent portion adjacent to the heating body mounting portion by capillary action; and
   condensation fins disposed in the tank that thermally connect to at least the radiation wall,
   wherein a fin pitch of the condensation fins is set to be equal or less than a maximum value that can secure a necessary condensation area and is set to be equal to or more than an average bubble radius of bubbles of the refrigerant released from an inner surface of the tank as a result of boiling, and
   a length of each of the condensation fin is set as shorter closer to the vapor passage.

2. A cooling apparatus according to claim 1, wherein the wick is made of a porous metallic sintered body.

3. A cooling apparatus according to claim 2, wherein the porous metallic sintered body has a transportation portion that transports the refrigerant to the adjacent portion, and the transportation portion has a void content of 50% or more and a void radius selected from a range of 10–100 $\mu$m.

4. A cooling apparatus according to claim 2, wherein the adjacent portion has a void content of 20% or more and a void radius selected from a range of 10–100 $\mu$m.

5. A cooling apparatus according to claim 2, wherein the porous metallic sintered body has one of a groove and a hole around the adjacent portion.

6. A cooling apparatus according to claim 2, wherein at least the adjacent portion of the porous metallic sintered body is integrated with the tank.

7. A cooling apparatus according to claim 2, wherein the porous metallic sintered body is arranged in a manner that the porous metallic sintered body can transport the refrigerant collected at a bottom of the tank to the adjacent portion in any attitude.

8. A cooling apparatus according to claim 2, further comprising:
   a heat transfer member protrusively provided in the porous metallic sintered body, and thermally connected to the heating body mounting portion, for transferring heat received by the heating body mounting portion to one of the inside of the porous metallic sintered body and a radiation wall facing the heating body mounting portion.

9. A cooling apparatus according to claim 2, wherein the porous metallic sintered body is arranged along one wall having the heating body mounting portion and another wall at least adjacent to the one wall.

10. A cooling apparatus according to claim 2, wherein:
    the tank is formed to a flat shape having a pair of inner walls, the pair of inner walls facing each other at a smaller distance than any other pair of inner walls constituting the tank; and
    the porous metallic sintered body is arranged on one of the inner walls.

11. A cooling apparatus according to claim 1, wherein the condensation fins are divided into plurality of divided fins in a longitudinal direction, and a height of each fin edge is continually reduced.

12. A cooling apparatus according to claim 1, wherein the condensation fins are divided into plurality of divided fins in a longitudinal direction, and a height of each divided portion of the divided fins is continually changed.

13. A cooling apparatus according to claim 1, wherein the condensation fins are divided into plurality of divided fins in a longitudinal direction, and a fin edge of each divided fins is sharpened.

14. A cooling apparatus according to claim 1, wherein a side surface of each condensation fin has a oblique surface that oblique from the condensation fin to the radiation wall.

15. A cooling apparatus according to claim 1, further comprising:
   an auxiliary wick disposed on at least one of the radiation wall and the condensation fin in the tank, for facilitating a drain of a condensed refrigerant.

16. A cooling apparatus according to claim 15, wherein the auxiliary wick is made of one of a porous metallic sintered body, a metallic fiber, a metallic gauze and non-metallic fiber.

17. A cooling apparatus according to claim 15, wherein the auxiliary wick is contacted to the wick.

18. A cooling apparatus according to claim 1, wherein one of the radiation wall and the condensation fin has a fin groove on the surface.

19. A cooling apparatus according to claim 1, wherein one of the radiation wall and the condensation fin is coated by a hydrophilic coat.

20. A cooling apparatus according to claim 1, wherein the tank has a control passage for controlling a flow of a vapor refrigerant.

* * * * *